United States Patent
Yoshimoto et al.

[19]

[11] Patent Number: 6,005,326
[45] Date of Patent: *Dec. 21, 1999

[54] SURFACE ACOUSTIC WAVE DEVICE

[75] Inventors: Susumu Yoshimoto; Yasushi Yamamoto, both of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/948,060

[22] Filed: Oct. 9, 1997

[30] Foreign Application Priority Data

Oct. 14, 1996 [JP] Japan ................................ 8-270943

[51] Int. Cl.$^6$ ............................ H03H 9/25; H01L 41/047
[52] U.S. Cl. ........................................ 310/313 B; 333/195
[58] Field of Search ........................ 310/313 B, 313 D, 310/313 R; 333/193–195

[56] References Cited

U.S. PATENT DOCUMENTS

| | | | |
|---|---|---|---|
| 3,979,702 | 9/1976 | Hunsinger et al. | 333/72 |
| 4,126,838 | 11/1978 | Mccusker et al. | 333/72 |
| 4,396,851 | 8/1983 | Kishimoto et al. | 310/313 B |
| 4,558,364 | 12/1985 | Yamada | 333/193 |
| 5,175,711 | 12/1992 | Shiba et al. | 310/313 R |
| 5,568,002 | 10/1996 | Kawakatsu et al. | 310/313 D |
| 5,909,157 | 6/1999 | Tanaka et al. | 333/193 |

FOREIGN PATENT DOCUMENTS

| | | | |
|---|---|---|---|
| 52-72136 | 6/1977 | Japan | 333/193 |
| 54-30761 | 3/1979 | Japan | 333/193 |
| 54-161247 | 12/1979 | Japan | 333/193 |
| 55-55615 | 4/1980 | Japan | 333/193 |
| 56-78224 | 6/1981 | Japan | 333/193 |
| 8-222989 | 8/1986 | Japan | H03H 9/145 |
| 62-219709 | 9/1987 | Japan | H03H 9/25 |
| 9-260996 | 10/1997 | Japan | H03H 9/145 |
| 1 427 226 | 3/1976 | United Kingdom | 333/194 |

*Primary Examiner*—Thomas M. Dougherty
*Attorney, Agent, or Firm*—Whitham, Curtis & Whitham

[57] ABSTRACT

A surface acoustic wave device includes a piezoelectric substrate, an input first interdigital electrode, and an output second interdigital electrode. The input first interdigital electrode is formed on the piezoelectric substrate. The output second interdigital electrode is formed on the piezoelectric substrate to be adjacent to the first interdigital electrode. A ratio of an overlap width to an aperture width of the first interdigital electrode and a ratio of an overlap width to an aperture width of the second interdigital electrode are set to different values, so that a transverse secondary mode is suppressed with one of the first and second interdigital electrodes while a transverse quaternary mode is suppressed with the other of the first and second interdigital electrodes.

7 Claims, 7 Drawing Sheets

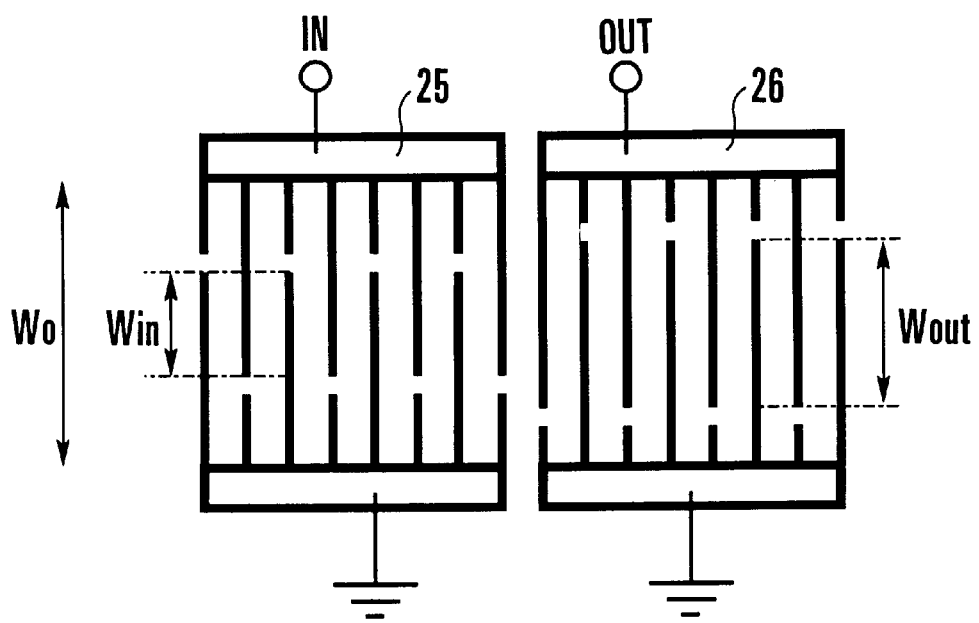
F I G. 4
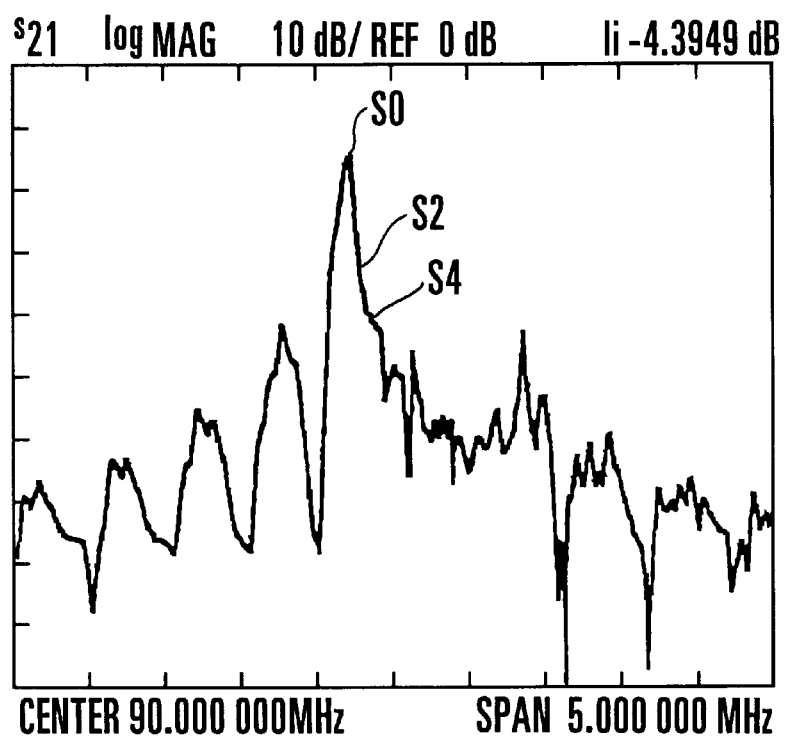
F I G. 5

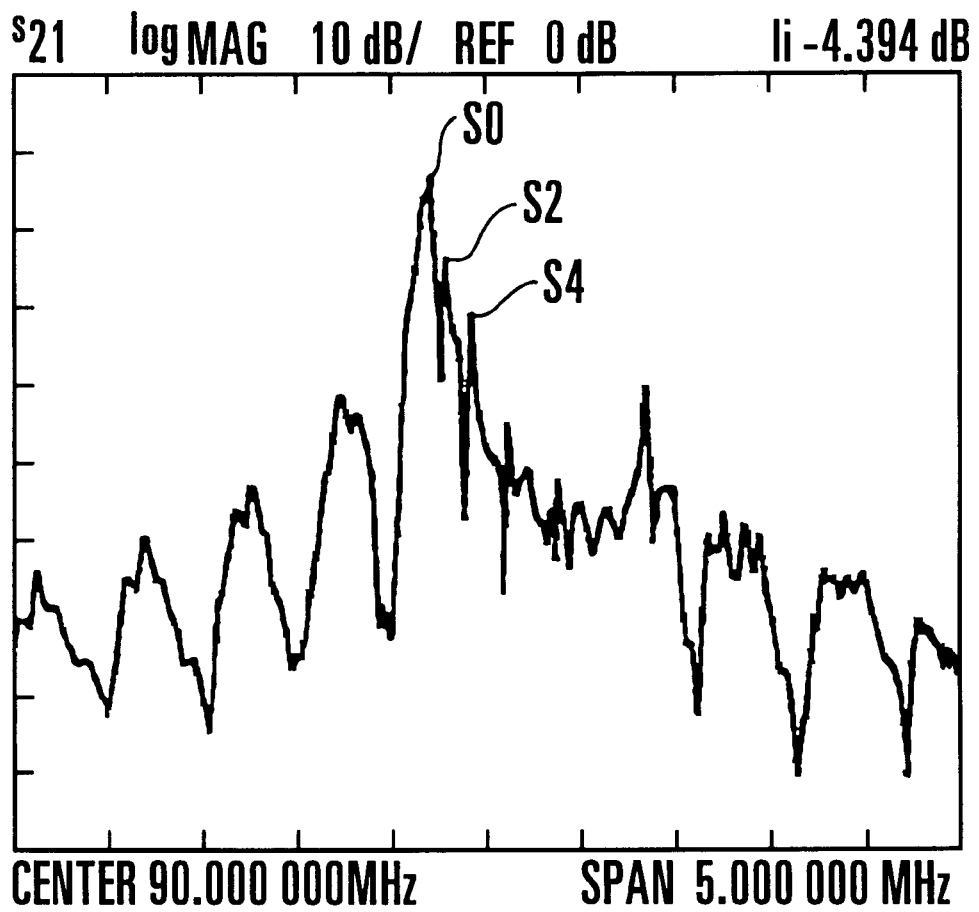
F I G. 6

SURFACE ACOUSTIC WAVE DEVICE

BACKGROUND OF THE INVENTION

The present invention relates to a surface acoustic wave device having interdigital electrodes and, more particularly, to a surface acoustic wave device which is formed on a piezoelectric substrate and operates with a VHF (Very High Frequency) or an UHF (Ultra High Frequency).

In a conventional resonator type surface acoustic wave device, the transverse mode (fundamental mode), in which the energy is distributed in a direction perpendicular to the propagating direction of a surface acoustic wave, becomes the major propagating mode, while high-order modes sometimes considered as spurious.

In order to suppress such the spurious, as a conventional technique, Japanese Patent Laid-Open No. 62-219709 discloses a surface acoustic wave resonator in which, regarding the shape of the interdigital electrodes, the ratio of the overlap width of the electrode fingers to the aperture width of the electrode fingers is 65% to 75% and this overlap width is constant within the interdigital electrodes.

In this surface acoustic wave resonator, as shown in FIG. 8, the potential present in the +/− range of the high-order transverse mode is effectively canceled by setting a ratio W/W0 of an overlap width W to an aperture width W0 of interdigital electrodes 71 and 72 from 65% to 75%, thereby suppressing the higher-order transverse mode. The characteristic feature of this conventional technique resides in that the ratios of the overlap widths to the aperture widths of the interdigital electrodes which are present in the surface acoustic wave device are equal among all the interdigital electrodes.

In the conventional technique described above, however, when a plurality of high-order modes are present, the device characteristics are degraded by a spurious mode of an order different from a order of the mode which is to be suppressed.

The reason for this is as follows. As shown in FIG. 8, a surface acoustic wave device has one or more interdigital electrodes, and the ratio W/W0 of the overlap width of its interdigital electrodes is constant throughout the surface acoustic wave device. In a case wherein only one high-order transverse mode is present, this high-order transverse mode can be suppressed.

When a plurality of high-order transverse modes are present, as in a case wherein the aperture width W0 is increased or the thickness of the metal thin film that forms the interdigital electrodes is increased, all the high-order transverse modes cannot be suppressed simultaneously.

SUMMARY OF THE INVENTION

It is an object of the present invention to provide a surface acoustic wave device in which the high-order transverse mode is suppressed.

In order to achieve the above object, according to the present invention, there is provided a surface acoustic wave device comprising a piezoelectric substrate, an input first interdigital electrode formed on the piezoelectric substrate, and an output second interdigital electrode formed on the piezoelectric substrate to be adjacent to the first interdigital electrode, wherein a ratio of an overlap width to an aperture width of the first interdigital electrode and a ratio of an overlap width to an aperture width of the second interdigital electrode are set to different values, so that a transverse secondary mode is suppressed with one of the first and second interdigital electrodes while a transverse quaternary mode is suppressed with the other of the first and second interdigital electrodes.

BRIEF DESCRIPTION OF THE DRAWINGS

FIG. 4 is a plan view of a surface acoustic wave filter according to the second embodiment of the present invention;

FIG. 5 is a graph showing the amplitude characteristics of the surface acoustic wave filter shown in FIG. 2;

FIG. 6 is a graph showing the amplitude characteristics of a surface acoustic wave filter that does not employ the present invention;

DESCRIPTION OF THE PREFERRED EMBODIMENTS

The present invention will be described in detail with reference to the accompanying drawings.

Figure 1:
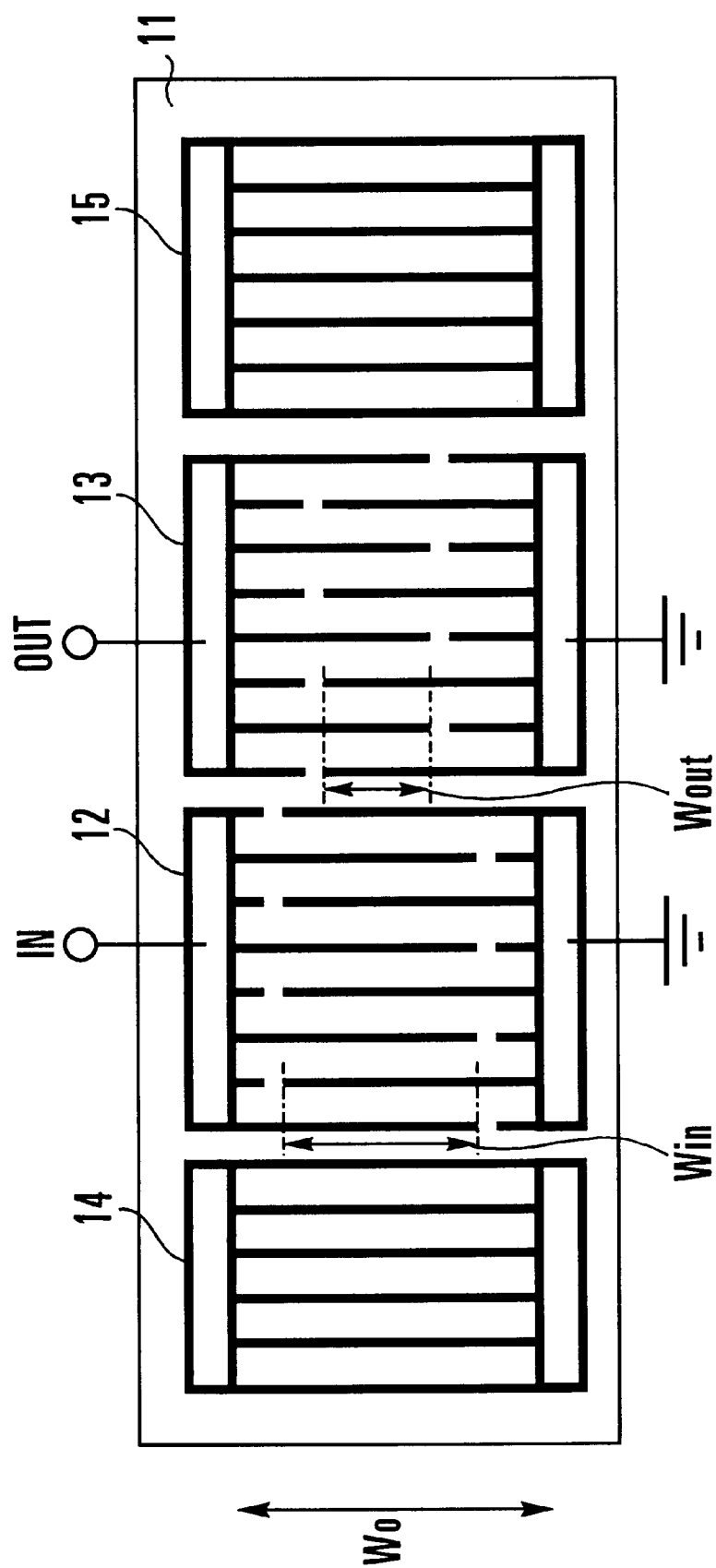
FIG. 1 is a plan view of a surface acoustic wave filter according to the first embodiment of the present invention.

FIG. 1 shows a resonator type surface acoustic wave filter according to the first embodiment of the present invention. Referring to FIG. 1, the surface acoustic wave filter has a piezoelectric substrate 11, an input interdigital electrode 12 and an output interdigital electrode 13 formed of thin metal films on the piezoelectric substrate 11 to be adjacent to each other, and two grating reflectors 14 and 15 formed on the two outer sides of the set of the interdigital electrodes 12 and 13 to trap the energy of the surface acoustic wave.

In this surface acoustic wave device, the ratios of an electrode finger overlap width Win and an electrode finger overlap width Wout to an aperture width W0 of the two interdigital electrodes 12 and 13, respectively, are set different from each other, so that a transverse secondary mode S2 is suppressed with one electrode while a transverse quaternary mode S4 is suppressed with the other electrode.

In this surface acoustic wave filter, in order to suppress the transverse secondary mode S2 and the transverse quaternary mode S4 with one and the other electrodes, respectively, the ratios W/W0 (Win/W0, Wout/W0) of the overlap widths Win and Wout to the aperture width W0 of the interdigital electrodes 12 and 13, respectively, are set to be different from each other.

The interdigital electrodes 12 and 13 are arranged such that the distal ends of the cross finger portions oppose each other. The aperture widths W0 of the interdigital electrodes 12 and 13 are equal to each other, and the overlap widths Win and Wout of the interdigital electrodes 12 and 13 are different from each other.

The characteristic feature of the present invention resides in that the ratios W/W0 of the overlap widths Win and Wout to the aperture width W0 of the interdigital electrodes 12 and 13 are set different between the input and output interdigital electrodes, and that the transverse secondary (S2) mode and the transverse quaternary (S4) mode are suppressed with one and the other electrodes, respectively.

The operation of the surface acoustic wave filter shown in FIG. 1 will be described in detail with reference to FIG. 2.

Figure 2:
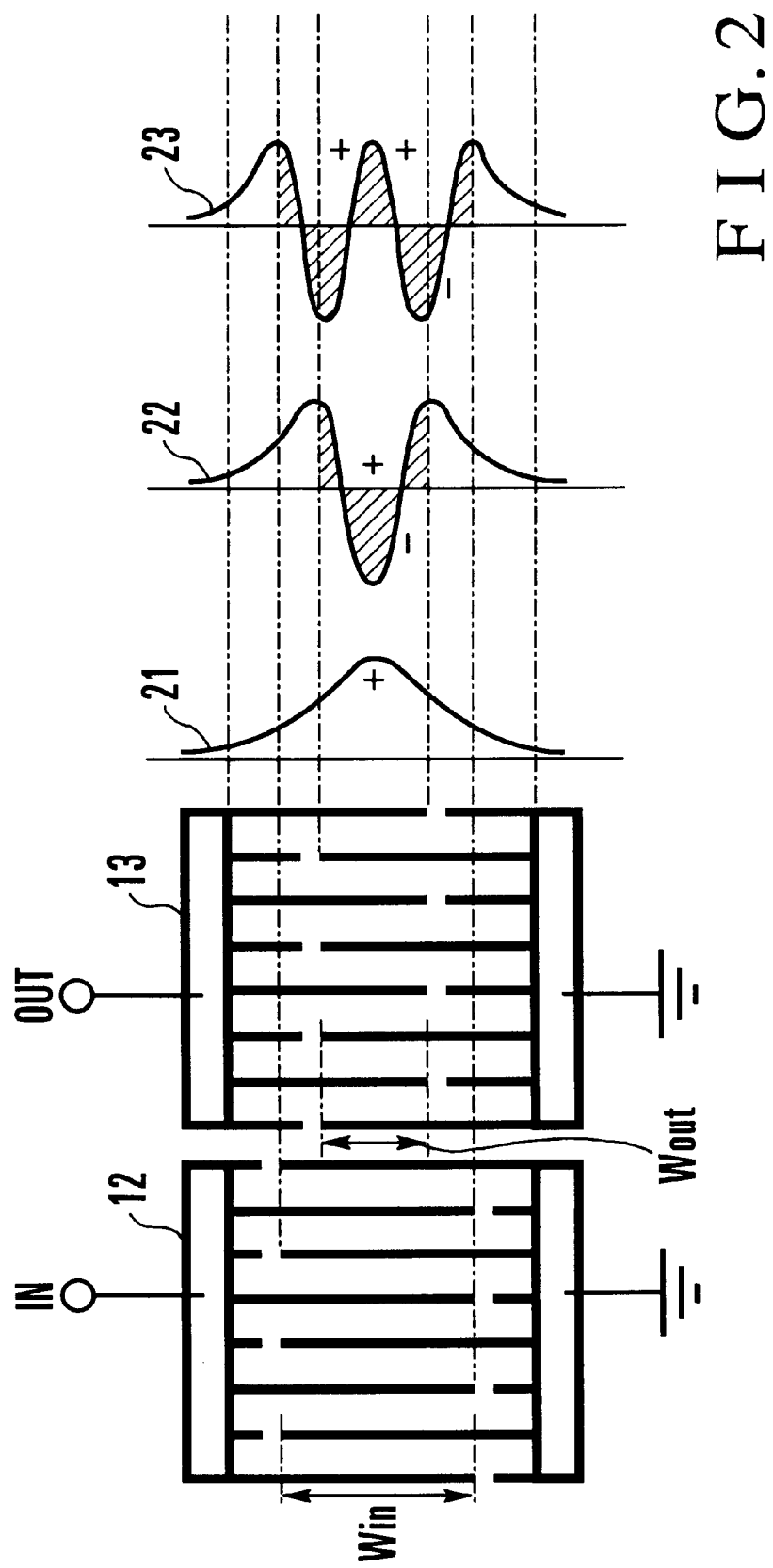
FIG. 2 is a view for explaining the transverse mode that occurs in the surface acoustic wave filter shown in FIG. 1.

Referring to FIG. 2, the energy distribution of a transverse fundamental mode distribution 21 is entirely located in a positive region, and this mode is generally the major propagation mode. Each of a transverse secondary mode distribution 22 of the transverse secondary (S2) mode and a transverse quaternary mode distribution 23 of the transverse quaternary (S4) mode has both the positive and negative regions. If W/W0 is selected such that the areas of the + and − regions are substantially equal, excitation of each of the transverse secondary mode that is shown in distribution 22 and transverse quaternary mode that is shown in distribution 23 are suppressed simultaneously.

FIG. 2 shows a case wherein W/W0 is selected such that the transverse secondary mode distribution 22 and the transverse quaternary mode distribution 23 are suppressed with the input and output electrodes, respectively.

Figure 3:
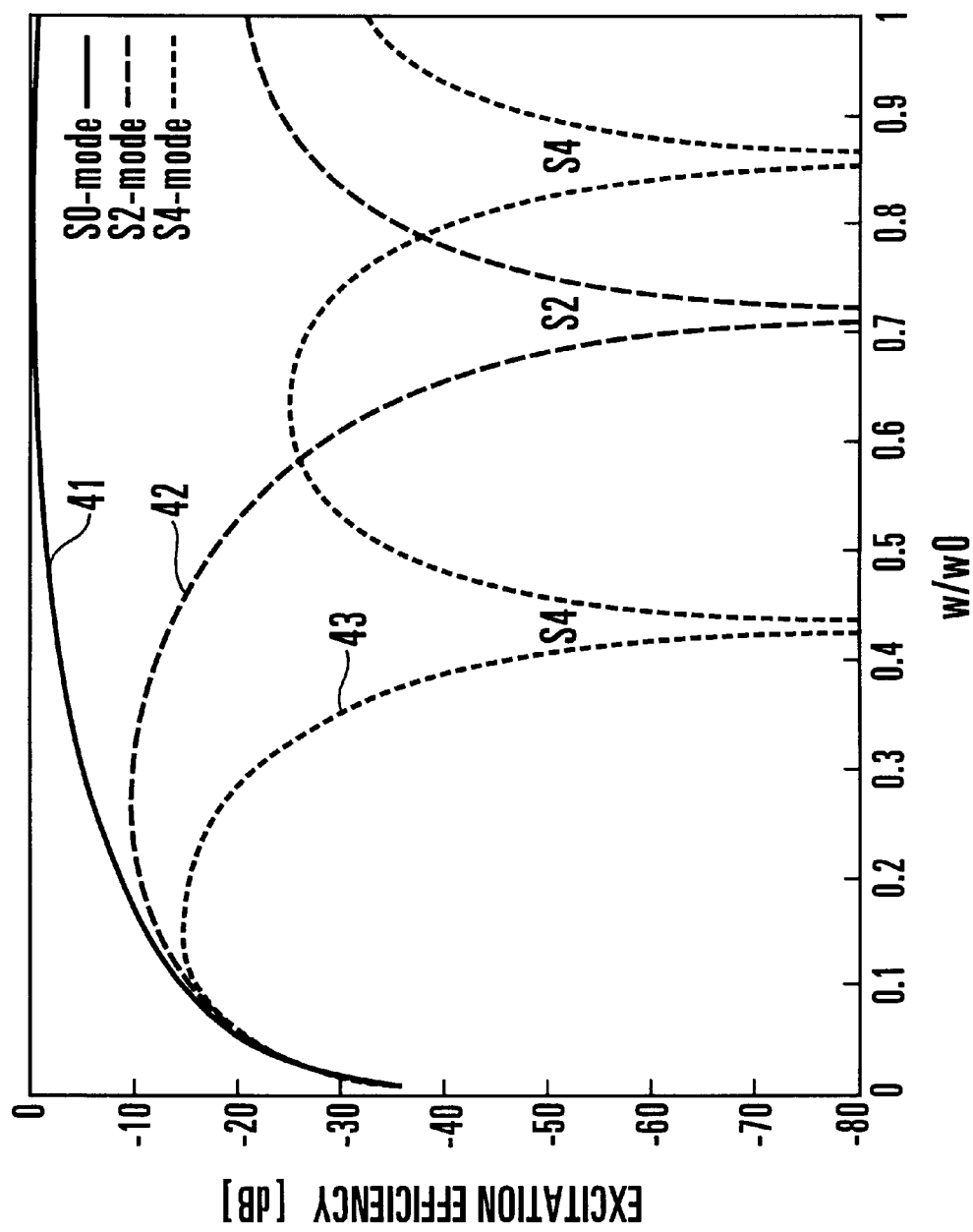
FIG. 3 is a graph showing the theoretical calculation of the excitation efficiency of the high-order transverse mode according to the present invention.

FIG. 3 shows the calculation result of the W/W0 dependency of the excitation efficiency [dB] of the each transverse mode. The calculation is performed based on an assumption that the substrate is an ST-cut quartz substrate, and the aperture width W0 is set to 40 $\lambda$ and a thickness H of the aluminum film that forms the interdigital electrode fingers is set to 0.98 $\mu$m. Note that $\lambda$ is the wavelength of the SAW (Surface Acoustic Wave). In FIGS. 3, reference numerals 41, 42, and 43 denote the excitation efficiencies of the transverse fundamental (S0) mode, transverse secondary (S2) mode, and transverse quaternary (S4) mode, respectively.

As is apparent from FIG. 3, the values of W/W0, with which the excitation intensity becomes the smallest, differ among the three modes. In this calculation example, if W/W0 of the interdigital electrode 12 and that of the interdigital electrode 13 are set to about 0.71 and 0.86, respectively, the excitation efficiency of the transverse secondary (S2) mode and that of the transverse quaternary (S4) mode are suppressed by 50 dB or larger than that when compared to those in the transverse fundamental (S0) mode.

A surface acoustic wave filter according to the second embodiment of the present invention will be described with reference to FIGS. 4 to 6.

FIG. 4 shows a resonator type surface acoustic wave filter formed on an ST-cut quartz substrate, and FIGS. 5 and 6 show its amplitude characteristics. In FIG. 4, reference numerals 25 and 26 denote input and output interdigital electrodes, respectively.

The center frequency of this resonator type surface acoustic wave filter is about 90 MHz, and aluminum is used as the material to form the input and output interdigital electrodes 25 and 26 (thickness: 0.98 $\mu$m). FIG. 6 is a graph showing a case not using a surface acoustic wave filter according to the present invention. Electrode finger overlap widths Win and Wout, and an aperture width W are all set to 40 $\lambda$.

FIG. 5 is a graph showing a case using a surface acoustic wave filter according to the present invention. An overlap width Win of the input interdigital electrode 25 is set to 28 $\lambda$ and an overlap width Wout of the output interdigital electrode 26 is set to 34 $\lambda$, while the aperture width is kept at 40 $\lambda$. In this case, Win/W0=0.7, and Wout/W0=0.86. In FIG. 6 that does not employ the present invention, the transverse secondary (S2) mode and transverse quaternary (S4) mode occur strongly on the high-frequency region of the fundamental mode. In contrast to this, in FIG. 5 that employs the present invention, the amplitude of each of the transverse secondary (S2) mode and transverse quaternary (S4) mode that are to be suppressed is decreased by 10 dB or larger than that.

In the surface acoustic wave filter employing the present invention, since the pair number of the input and output electrodes need not be equal, they can be selected to equalize the input and output impedances.

Figure 7:
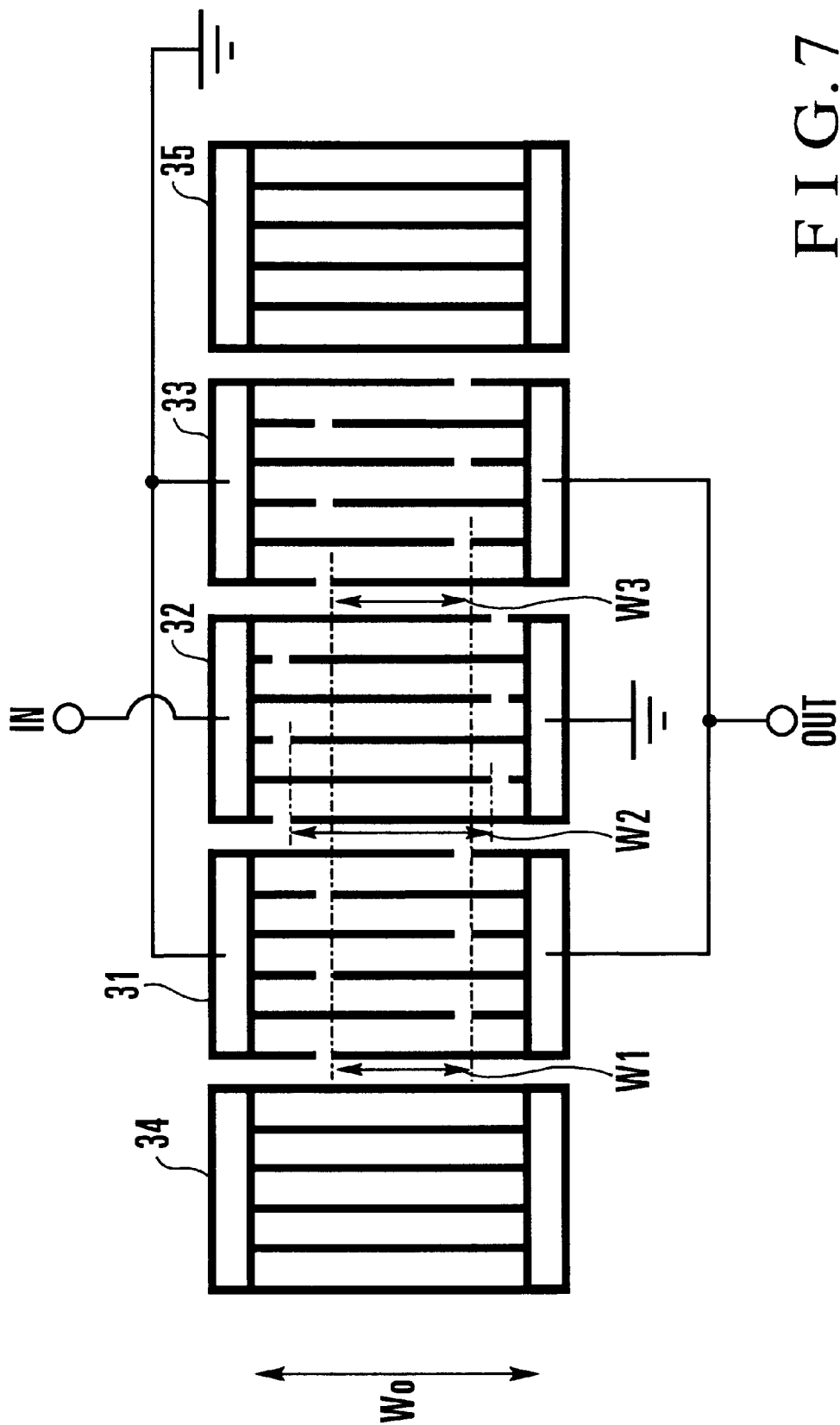
FIG. 7 is a plan view of a surface acoustic wave filter according to the third embodiment of the present invention.
Figure 8:
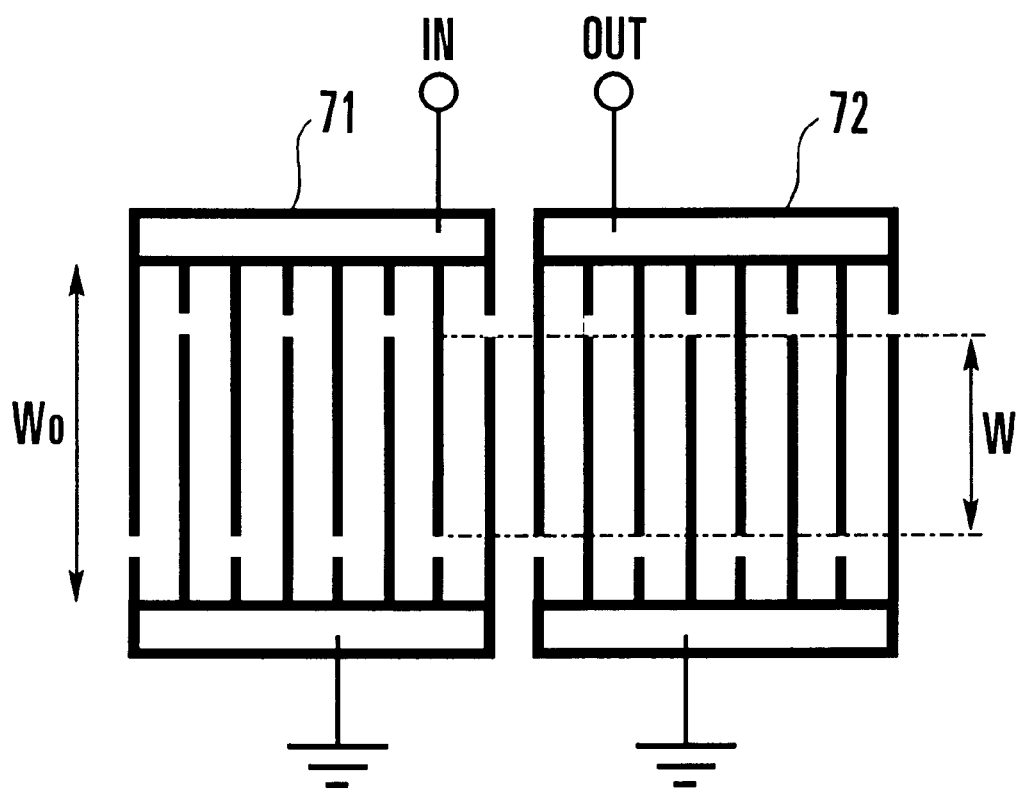
FIG. 8 is a plan view of a conventional surface acoustic wave filter.

A surface acoustic wave filter according to the third embodiment of the present invention will be described with reference to FIG. 7. FIG. 7 shows a three-electrode type surface acoustic wave resonator filter. This filter has three interdigital electrodes 31, 32, and 33 in its structure. Grating reflectors 34 and 35 are arranged on the two sides of the set of the interdigital electrodes 31, 32, and 33 that are arranged adjacently.

Output-side electrode finger overlap widths W1 and W3 are set equal, while an input-side electrode finger overlap width W2 is set different from the electrode finger overlap width W1 or W3. In this structure as well, each of the input- and output-side electrodes can suppress one high-order transverse mode.

As has been described above, according to the present invention, the high-order transverse mode, i.e., the transverse secondary and quaternary mode, can be suppressed simultaneously by setting the ratios of the overlap widths to the aperture width of the input and output electrodes to be different from each other.

What poses a problem in the transverse mode of the surface acoustic wave filter is the high-order transverse mode with respect to the transverse fundamental mode, which is the major resonance mode. The distribution of the fundamental mode is entirely located in the positive region, whereas the distribution of the high-order transverse mode, which is the spurious, has both the positive and negative regions. When the overlap widths of the interdigital electrode fingers are appropriately selected such that the areas of the + and − regions are substantially equal to each other in the high-order mode distribution, the energy generated in the high-order mode is substantially canceled.

In the present invention, the ratios of the overlap widths W to the aperture width W0 of the interdigital electrodes are selected such that the transverse secondary mode is canceled with one electrode while the transverse quaternary mode is canceled with the other electrode. Therefore, two high-order spurious modes can be suppressed simultaneously.

What is claimed is:

1. A surface acoustic wave device comprising:
   a piezoelectric substrate;
   an input first interdigital electrode formed on said piezoelectric substrate; and
   an output second interdigital electrode formed on said piezoelectric substrate adjacent said first interdigital electrode,
   wherein a ratio of an overlap width to an aperture width of said first interdigital electrode and a ratio of an overlap width to an aperture width of said second interdigital electrode are set to different values, said ratio of an overlap width to an aperture width of said second interdigital electrode being selected so that a transverse secondary mode is suppressed and said ratio of an overlap width to an aperture width of said first interdigital electrode being selected so that a transverse quaternary mode is suppressed.

2. An apparatus according to claim 1, wherein the ratio of said first interdigital electrode and the ratio of said second interdigital electrode are set so that areas of plus and minus regions of energy distributions corresponding to said transverse secondary mode and said transverse quaternary mode are substantially equal, so as to allow said transverse secondary mode and said transverse quaternary mode to be suppressed simultaneously by said first interdigital electrode and said second interdigital electrode.

3. An apparatus according to claim 2, wherein
said first and second interdigital electrodes have a same aperture width, and
said first interdigital electrode has an overlap width which is different from that of said second interdigital electrode.

4. An apparatus according to claim 2, further comprising a pair of grating reflectors formed on two sides of a set of said first and second interdigital electrodes to trap an energy of a surface acoustic wave propagating between said first and second interdigital electrodes.

5. An apparatus according to claim 2, further comprising
an output third interdigital electrode formed on a side opposite to said second interdigital electrode to be adjacent to said first interdigital electrode, and
a pair of grating reflectors formed on two sides of a set of said first to third interdigital electrodes to trap an energy of a surface acoustic wave propagating between said first and second interdigital electrodes and between said first and third interdigital electrodes,
wherein a ratio of an overlap width to an aperture width of said third interdigital electrode is set to be equal to the ratio of the overlap width to the aperture width of said second interdigital electrode.

6. An apparatus according to claim 5, wherein
said first to third interdigital electrodes have the same aperture width,
said third interdigital electrode has an overlap width which is the same as that of said second interdigital electrode, and
said first interdigital electrode has an overlap width which is different from those of said second and third interdigital electrodes.

7. In a method for suppressing spurious modes in an acoustic wave filter, said filter including a first interdigital electrode formed on said piezoelectric substrate and a second interdigital electrode formed on said piezoelectric substrate adjacent said first interdigital electrode, said improvement consisting of:
setting a ratio of an overlap width to an aperture width of said first interdigital electrode and a ratio of an overlap width to an aperture width of said second interdigital electrode to different values, so that a transverse secondary mode is substantially suppressed by a first predetermined amount with one of said first and second interdigital electrodes while a transverse quaternary mode is substantially suppressed by a second predetermined amount with the other of said first and second interdigital electrodes.

* * * * *